United States Patent [19]

Gill et al.

[11] Patent Number: 5,032,533
[45] Date of Patent: Jul. 16, 1991

[54] METHOD OF MAKING A NONVOLATILE MEMORY CELL WITH FIELD-PLATE SWITCH

[75] Inventors: Manzur Gill, Arcola; Sebastiano D'Arrigo, Houston, both of Tex.

[73] Assignee: Texas Instruments Incorporated, Dallas, Tex.

[21] Appl. No.: 444,585

[22] Filed: Dec. 4, 1989

[51] Int. Cl.[5] .......................................... H01L 21/70
[52] U.S. Cl. ...................... 437/43; 437/51; 437/52; 437/193; 437/195; 437/228; 437/233; 437/235
[58] Field of Search .................. 437/43, 51, 52, 193, 437/195, 233, 228, 235, 69; 357/23.5, 51, 53; 365/185

[56] References Cited

U.S. PATENT DOCUMENTS

| | | | |
|---|---|---|---|
| 4,429,239 | 1/1984 | Cranford et al. | 357/23.8 |
| 4,561,004 | 12/1985 | Kuo et al. | 365/185 |
| 4,612,629 | 9/1986 | Harari | 357/23.6 |
| 4,736,342 | 8/1988 | Imondi et al. | 365/94 |
| 4,853,895 | 8/1989 | Mitchell et al. | 357/23.5 |
| 4,947,222 | 8/1980 | Gill et al. | 357/53 |

Primary Examiner—Brian E. Hearn
Assistant Examiner—Tom Thomas
Attorney, Agent, or Firm—W. James Brady; James T. Comfort; Melvin Sharp

[57] ABSTRACT

An array of nonvolatile memory cells are formed at a face of a semiconductor body, the cells including source regions and including drain regions that are part of a common drain column conductor. Each cell has first and second sub-channel regions between source and drain. The conductivity of the first sub-channel regions of each cell is controlled by a field-plate conductor formed over and insulated from the first sub-channel region. The conductivity of each of the second sub-channel regions is controlled by a floating-gate conductor formed over and insulated from the second sub-channel region. A row line, including control gates, is located above and insulated from the floating gates of the cells for reading, programming and erasing the cells. The field-plate conductor switch provided isolation of the cells during programming.

4 Claims, 4 Drawing Sheets

Fig.3a

METHOD OF MAKING A NONVOLATILE MEMORY CELL WITH FIELD-PLATE SWITCH

RELATED PATENT APPLICATION

This application discloses subject matter also disclosed in co-pending U.S. patent application Ser. No. 07/374,381, filed June 30, 1989 and also assigned to Texas Instruments Incorporated.

BACKGROUND OF THE INVENTION

This invention relates to nonvolatile semiconductor memory devices, more particularly, to an electrically-erasable, electrically-programmable ROM (read-only-memory) of the floating-gate type and to a method for making such a device.

EPROMs, or electrically-programmable ROMs, are nonvolatile memory field-effect devices with floating-gate structures. In general, an EPROM floating gate is programmed by applying proper voltages to the source, drain and control gate of each cell, causing high current through the source-drain path and charging of the floating gate by hot electrons. The EPROM type of device is usually erased by ultraviolet light, which requires a device package having a quartz window above the semiconductor chip. Packages of this type are expensive in comparison with the plastic packages ordinarily used for other memory devices such as DRAMs (dynamic-random-access-memories). For this reason, EPROMs are generally more expensive than plastic-packaged devices. EPROM devices of this type, and methods of manufacture, are disclosed in U.S. Pat. Nos. 3,984,822; 4,142,926; 4,258,466; 4,376,947; 4,326,331; 4,313,362; 4,373,248; or 4,750,024; for example.

EEPROMs, or electrically-erasable, electrically-programmable ROMs, have been manufactured by various processes, and usually require much larger cell sizes than standard EPROMs. The structures and the manufacturing processes are usually more complex. EEPROM arrays can be mounted in opaque plastic packages that reduce the packaging cost. Nevertheless, EEPROM arrays have been more expensive on a per-bit basis, in comparison with EPROM arrays, due to larger cell size and to more complex manufacturing processes.

As compared to EPROM arrays, EEPROM arrays require a wider range of voltage sources for the purposes of programming, reading and erasing. Because the bitlines are connected to many cells in the array other than the cell being programmed, read, or erased, the wider range of voltages increases the possibility that one or more of the other cells will be inadvertently programmed or erased. The problem is particularly present in so-called "virtual-ground" arrays such as that disclosed in U.S. Pat. No. 4,281,397.

Flash EEPROMs have the advantage of smaller cell size in comparison with standard EEPROMs because the cells are not erased individually. Instead, the array of cells is erased in bulk.

Currently available flash EEPROMs require at least two external power supplies, one for programming and erasing and another for reading. Typically, a 12-volt power supply is used for programming and erasing and a 5-volt power supply is used during read operations. It is desirable, however, to employ a single relatively low-voltage supply for all of the programming, erasing and reading operations. For example, on-chip charge-pump techniques may be used to generate higher voltages from the 5-volt supply if the memory cells of the array are designed to be programmed and erased while drawing a relatively small current. In general, cells designed to use Fowler-Nordheim tunnelling for programming and erasing require relatively small current in comparison to the current required when using hot-electron programming.

The EEPROMs disclosed in co-pending U.S. patent applications Ser. No. 07/219,528; No. 07/219,529 and No. 07/219,530 provide greatly improved structures and methods for making cells having reduced size and ease of manufacture, resulting in a device requiring one relatively low-voltage (perhaps +5 v) external power supply for the chip. The devices of those inventions use Fowler-Nordheim tunnelling for erasure and for programming. The EEPROM disclosed in U.S. patent application Ser. No. 07/360,558 discloses a structure that does not include a split control gate, thereby decreasing the space required on an integrated circuit substrate as compared to a structure with a split gate, yet can be down-scaled in size and can be packaged in a less expensive opaque plastic package. However, removal of the split gate results in reading errors if some of the memory cells are over-erased.

The size of a memory cell structure may be decreased from that of the structure disclosed in U.S. patent application Ser. No. 07/360,558, for example, by forming cells such that pairs of cells share the same drain structure, as in U.S. patent application Ser. No. 07/374,381, also assigned to Texas Instruments Incorporated. The structure disclosed in that application uses a field-plate electrode to provide isolation between cells in a pair during programming, reducing the number of bitlines required per column of cells from two to only one and one-half. The channels of the cell structures described in the latter Application are divided into three sub-channel regions. The conductivities of the three series-connected regions are individually controlled by the field-plate electrode, the control gate, and the floating gate. However, the size of the memory cell may be further decreased, and the on-state conductivity of the memory cell may be improved, by eliminating the channel subregion controlled by the control gate.

SUMMARY OF THE INVENTION

In accordance with one embodiment of the invention, a nonvolatile memory array, or an EEPROM array, is constructed in a manner that each cell shares a drain column line with another cell, and therefore uses only one and one-half buried bit lines per cell, thus saving array area as compared to the structure the aforementioned application Ser. No. 07360,558, for example.

A source region is formed in a semiconductor layer of a first conductivity type, the source region being of a second, opposite conductivity type. A drain region is formed in the semiconductor layer to be of the second conductivity type and to be spaced from the source region. The source and drain regions define a channel region that in turn comprises first and second sub-channel regions.

A floating-gate conductor is disposed over and insulated from the face of the semiconductor layer in which the source and drain regions are formed, and the floating-gate conductor overlaps the field-plate conductor described below. A portion of the floating-gate conductor is disposed over and insulated from the second sub-channel region, so as to render it non-conductive when a negative charge of sufficient magnitude resides on the floating-gate conductor. A further portion of this floating-gate conductor is formed over and insulated from the source region. A tunnel window may be formed between this further portion of the floating-gate conductor and the source region to allow selective programming and erasing of the floating-gate conductor.

A field-plate conductor has at least a portion thereof disposed over and insulated from the first sub-channel region so as to render it conductive upon application of a predetermined field-plate read voltage to the field-plate conductor. A portion of the control-gate conductor is formed over and insulated from the floating-gate conductor so as to be electrically coupled thereto, such that upon application of predetermined programming voltages to the source region and the control-gate conductor, the floating-gate conductor will be programmed (such as with a negative charge) as a result.

The drain regions, which are preferably part of an elongate implanted region at the face of the semiconductor layer, the elongate region shared by two cells on either side thereof. The field-plate conductor resides over and insulated from the elongate region.

During programming of a selected cell, the field-plate conductor is held at ground potential, or a negative potential, to isolate the selected cell from the deselected cell of a cell pair by causing the sub-channel region under the field-plate conductor to be non-conductive. During reading of a selected cell, the field-plate conductor is held at a positive voltage (+5 V, for example), allowing the sub-channel region under the floating gate to be in series with the conductive sub-channel region under the field-plate conductor.

One of the principal technical advantages of the invention are that only three bitlines for a pair of cells are needed, since the drain bitline is shared between two adjacent cells. Another advantage is that the field-plate conductor isolates the two cells of each pair during programming operation. The cell area is reduced and the channel conductivity is improved in comparison to that of the aforementioned application Ser. No. 07/374,381.

BRIEF DESCRIPTION OF THE DRAWINGS

The novel features believed characteristic of the invention are set forth in the appended claims. The invention itself, however, as well as other objects and advantages thereof, will be best understood by reference to the following description of particular embodiments thereof, when read in conjunction with the accompanying drawings, in which:

DETAILED DESCRIPTION OF SPECIFIC EMBODIMENT

Figure 1:
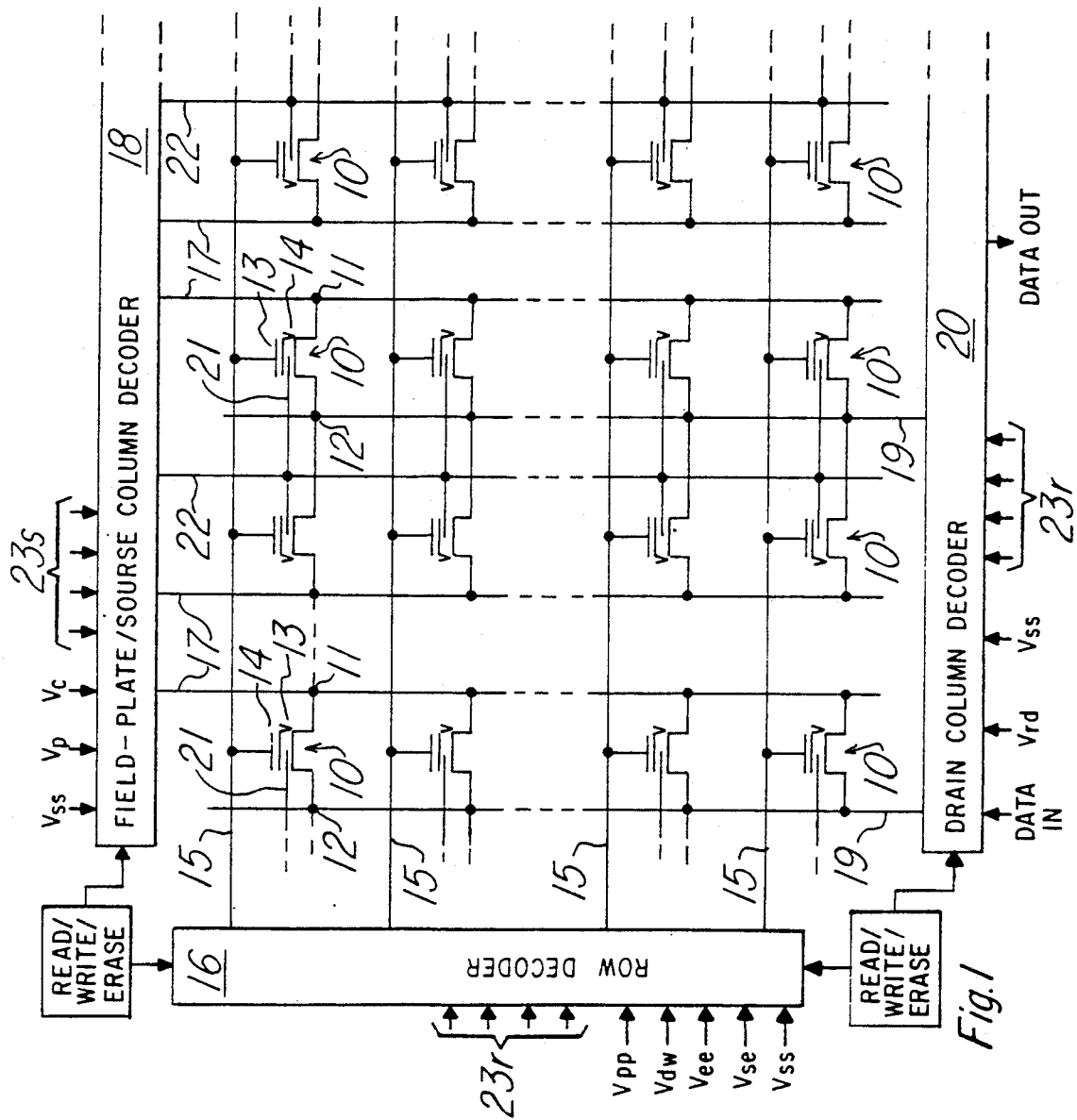
FIG. 1 is a schematic representation, in partial block form, of the circuit of the device of this invention.

Referring to FIG. 1, an array of memory cells, which is an integral part of a memory chip, is shown according to the invention. Each cell is a floating-gate transistor 10 having a source 11, a drain 12, a floating-gate layer 13 and a control gate 14. Each of the gates 14 in a row of cells is connected to a row line 15, and each of the row lines 15 is connected to a row decoder 16. Each of the source electrodes 11 in a column of cells is connected to, or included in, one of a number of parallel, elongate source column lines 17, and each of the source column lines 17 is connected to a field-plate/-source column decoder 18, which includes source column decoding circuitry and, optionally field-plate column decoding circuitry. Each of the drain electrodes 12 in a column of cells is connected to, or included in, one of a number of parallel, shared, elongate drain column lines 19, and each of the shared drain column lines 19 is connected to a drain column decoder 20. Source column lines 17 and drain column lines 19 are formed at an angle to row line conductors 15.

In addition, each cell 10 has a field-plate electrode 21. Each field-plate electrode 21 is connected to, or is part of, a field-plate column line 22 and each field-plate column line 22 is connected to field-plate/source column decoder 18, which includes field-plate column decoding circuitry and, optionally, may include source column decoder circuitry. While the field-plate column decoding circuitry is illustrated as being included with the source-column decoding circuitry, it may be separate or it may be included with drain column decoding circuitry.

In a write or program mode, the field-plate/source column decoder 18, in response to field-plate/source column address signals on lines 23s, may function to place a preselected blocking voltage (Vss, ground or negative voltage) on field-plate conductor 22. The row decoder 16 may function, in response to row address signals on lines 23r, to place a preselected first programming voltage Vpp (approx. +16 V to +18 V) on a selected row line 15, including a selected control-gate conductor 14. Field-plate/source column decoder 18, in response to signal on lines 23s, may function to place a preselected second programming voltage (Vss, reference potential, or non-positive value) on selected source column line 17, which includes a selected source region 11. The preselected second programming voltage must differ sufficiently from the first preselected programming voltage that excess electrons will migrate, as by Fowler-Nordheim tunneling, for example, to the selected floating-gate conductor 13 and, as a result, program that selected floating-gate conductor 13. Field-plate/source column decoder 18 may optionally, in response to signal on lines 23s, place a third preselected voltage Vp (approx. +7 V above Vss) on deselected source column lines 17, including deselected source regions 11 within the array, to prevent a disturb of programmed floating-gate conductors associated with the non-selected source regions. The row decoder 16 may optionally, in response to signals on line 23r, place a fourth preselected voltage Vdw (approx. +7 V) on deselected row lines 15, including non-selected control-gate conductors 14. Fourth preselected voltage Vdw should be sufficiently close to the second programming voltage that the floating-gate conductors 13 associated with the deselected row lines 15 will not be programmed as a result, but should be sufficiently high that stress will be reduced across any tunnelling windows of cells in non-selected row lines, thereby avoiding de-programming of pre-programmed cells. The third and/or the fourth preselected voltages may be the same and should be place on the respective electrodes before both first and second preselected programming voltages are placed on their respective electrodes. The first programming voltage may be placed on the control-gate conductors 14 in a gradual manner so as to reduce voltage-induced stress on the selected cell 10. The shared drain column lines 19 may be left floating. The floating gate 13 of the selected cell 10 will be charged with electrons, and the electrons in turn render the source-drain path under the floating gate 13 of the cell 10 nonconductive, a state which is read as a "zero" bit. Non-selected cells have source-drain paths under the floating gate 13 that remain conductive, and those cells are read as "one" bits.

During a "flash" erase mode, the field-plate/source column decoder 18 functions to apply a positive voltage Ve (approx. +5 V) to all the source columns 17 and to apply a low voltage (Vss, ground or negative voltage) to field-plate column lines 22. The drain column decoder 20 functions to leave all of the shared drain column lines 19 floating. The row decoder 16 functions to apply a high negative voltage Vee (approx. −11 V) to all the row lines 15. The excess electrons are removed from the floating gates of programmed cells. Selective erasing may be accomplished by changing Vee to perhaps −5 V and by applying voltage Vee to the selected row line 15 while perhaps +10 V is applied to the deselected row lines 15 and the selected source column line 17. Ground or reference voltage is applied to the deselected source column lines 17. Other applied voltages are the same as those of the flash erase example.

In the read mode, the field-plate/source column decoder 18 functions, in response to signal on lines 23s to place a preselected first read voltage Ve (approx. +5 V) on a selected field-plate column line 22, including the field-plate conductor of the selected cell, such that a first sub-channel region of that cell will be rendered conductive. The row decoder 16 functions, in response to row address signals on lines 23r, to place a preselected second read voltage Vse (approx. +3 V) on a selected row line 15, including the control-gate conductor 14 of the selected cell 10. The preselected second read voltage Vse should be preselected such that its presence on the control-gate conductor 14 of a cell 10 will not program the floating-gate conductor 13 of that cell 10. Where applicable, the preselected second read voltage Vse should be preselected such that its presence on the control-gate conductor 14 of a cell 10 will not erase the floating gate conductor 13 of that cell 10. The drain column decoder 20 functions, in response to drain column address signals on lines 23d, to place preselected third read voltage Vrd (approx. +1 V to +1.5 V) to the selected shared drain column 19, including the drain region 12 of the selected cell 10. The field-plate/source column decoder 18 functions to connect all source columns 17 to ground (or Vss) and to connect field-plate column lines 22 to Ve (approx 5 V). Applying Ve to the field-plate column 22 renders the sub-channel region under the field plate 21 conductive. The row decoder 16 function, in response to signals on lines 23r, to apply a low voltage (ground or Vss) to deselected row lines 15. Selected cells, if having a floating-gate conductors in a programmed state, will have second sub-channel regions that are rendered nonconductive. That is, current will not flow from the drain to the source through the first and second sub-channel regions and a "zero" will be sensed. Selected cells, if having floating-gate conductors in a non-programmed state, will have second sub-channel region that are rendered conductive. That is, current will flow from the drain to the source through the first and second sub-channel regions and a "one" will be sensed. The presence or absence of current flow may be detected by a sense amplifier (not shown) connected to the DATA OUT terminal. Connections to the source 11 and drain 12 regions in the example above are interchangeable, and data may be sensed at the source terminal if the third read voltage Vrd is applied to the source 11.

For convenience, a table of read, write and erase voltages is given in the table below:

TABLE

| | Read | Write | Erase | |
| --- | --- | --- | --- | --- |
| | | | Selected | Flash |
| Selected Row Line (Control Gate) | 3 V | 16–18 V | −5 V | −11 V |
| Deselected Row Lines | 0 V | 7 V | 10 V | — |
| Selected Source Line | 0 V | 0 V | 10 V | 5 V |
| Deselected Source Lines | Float | 7 V | 0 V | 5 V |
| Drain Lines | 1–1.5 V | Float | Float | Float |
| Field-Plate Line | 5 V | 0 V | 0 V | 0 V |

Figure 2:
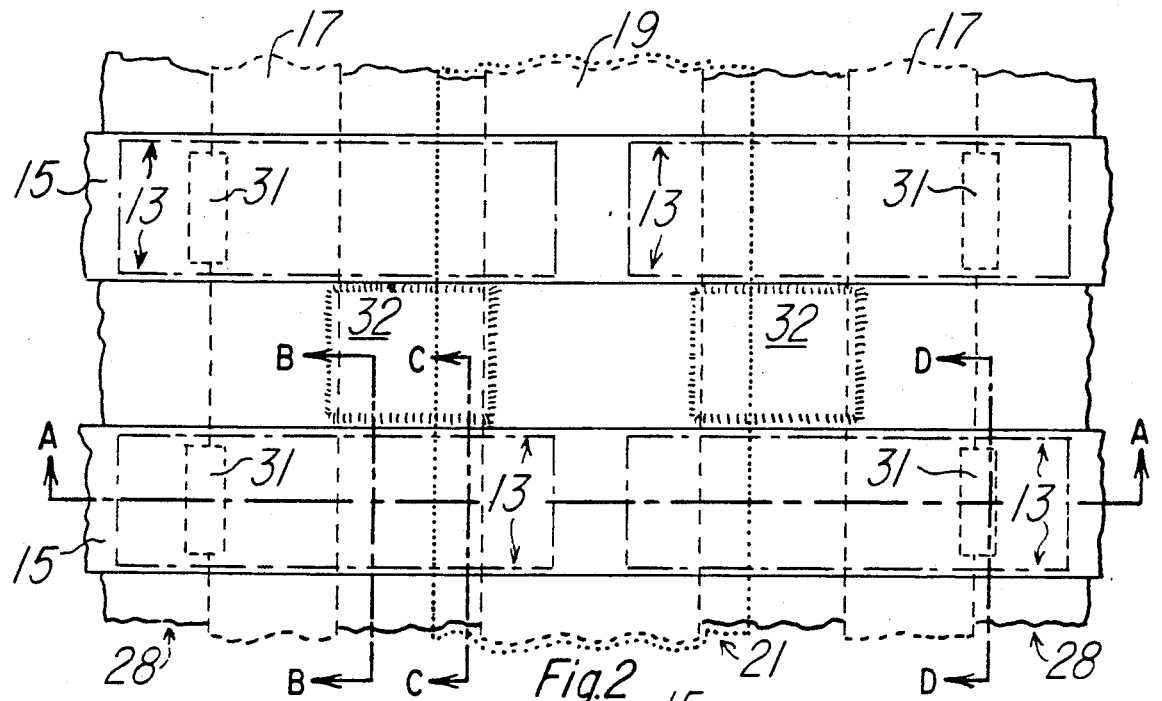
FIG. 2 is a plan view of a small part of a semiconductor chip of FIG. 1 having memory cells according to one embodiment.
Figure 3A:
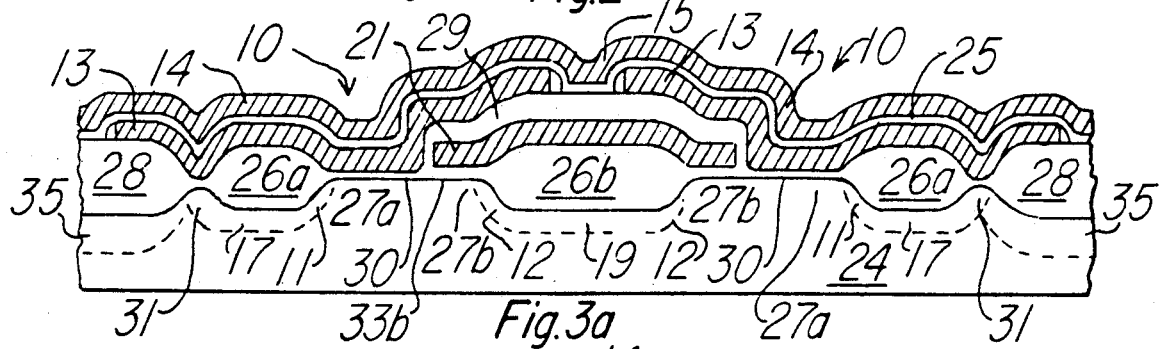
FIGS. 3a–3d are elevation views in section of the semiconductor device of FIG. 2, respectively taken along the lines a—a, b—b, c—c and d—d of FIG. 2.
Figure 3B:
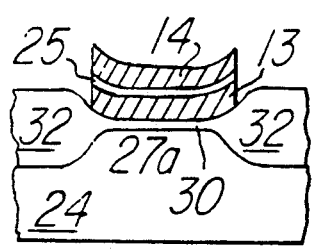
Figure 3C:
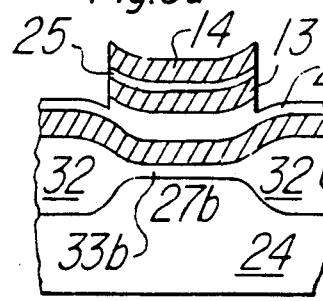
Figure 3D:
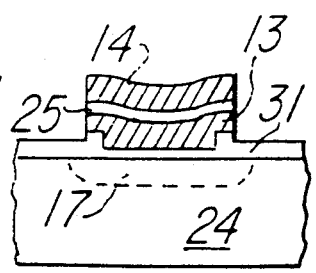

Referring now to FIGS. 2 and 3a–3e, an array of electrically-erasable, electrically-programmable memory cells 10 is shown formed in a face of a semiconductor body, such as a silicon substrate, 24. Only a very small part of the substrate 24 is shown in the Figures, it being understood that these cells 10 are part of an array of a very large number of such cells 10. A number of control gates 14/row lines 15 are formed by second-level polycrystalline silicon (polysilicon) strips extending along the face of the substrate 24. Control gates 14 are separated from floating-gate layers 13 by inter-level insulator layers 25. Source column lines, or bitlines, 17 are formed beneath first thermal oxide regions 26a in the face. Shared drain column lines, or bitlines, 19 are formed beneath second thick thermal oxide regions 26b in the face. A shared drain column line 19 is parallel to and spaced from source column lines 17. These buried bitlines 17,19 include the source regions 11 for each of the cells 10 and include the drain regions 12 for each of a pair of adjacent cells 10. A floating-gate layer 13 for each cell 10 is formed by a second-level polysilicon layer extending across a sub-channel region 27a between spaced-apart source region 11 and drain region 12. Each floating-gate layer 13 also extends over at least a part of thermal oxide region 26b, extends over thermal oxide region 26a, and extends over at least a part of LOCOS field oxide region 28. LOCOS field oxide regions 28 electrically isolate adjacent source column lines 17. A field-plate conductor 21 extends over sub-channel regions 27b of each cell 10 of a cell pair and over thermal oxide region 26b. Field-plate conductor 21 acts to switch the sub-channel regions 27b from a conductive state to a nonconductive state, depending on the voltages applied to field-plate conductor 21. Field-plate conductor 21 is separated from floating gates 13 of cell 10 pair by a field-plate insulator layer 29. A gate insulator, such as an oxide layer, 30 is formed over the sub-channel regions 27a and 27b. The two "horizontal", or row-direction, edges of the floating-gate layer 13 for a cell 10 are aligned with the edges of a row line 15. For explanatory purposes, the edges are illustrated in FIG. 2 as being slightly misaligned.

A Fowler-Nordheim tunnelling window 31 for programming and erasure may be formed over source bitline 17 between first thermal oxide regions 26a and LOCOS field oxide regions 28. The tunnel insulator at tunnel window 31 may be a thinner oxide layer, about 100 A, compared to the oxide dielectric layer 30 of about 350 A at the channel. Programming and erasing can be performed at relatively low externally-applied voltages using this structure. The capacitance between layer 14 and layer 13, compared to the capacitance between floating-gate layer 13 and source 11 or substrate 24, is more favorable because the floating-gate layer 13 extends out across thick thermal oxide regions 26a and 26b and LOCOS field oxide region 28. Therefore, a larger fraction of the programming/erasing voltages applied between control gate 14 and source 11 will appear between floating-gate layer 13 and source 11. The cell 10 is referred to as "contact-free" in that no source/drain contact is needed in the vicinity of cell 10 itself.

The channels of cells 10 in adjacent rows may be electrically isolated by LOCOS field oxide regions 32. In the alternative, the channels of adjacent cells 10 may be electrically isolated by junction isolation using a P-type dopant in the same region as the LOCOS field oxide regions 32.

Note that the array of cells 10 is not of the "virtual-ground-circuit" type; that is, there is a separate bitline 17 for the sources 11 in a column of cells 10 and a shared bitline 19 for drains 12 in a column of cells 10.

A method of making the device of FIGS. 1, 2, and 3a–3e will be described in reference to FIGS. 4a–4f. The starting material is a slice of P-type silicon of which the (P-) epitaxial semiconductor layer or substrate 24 is only a very small portion. The slice is perhaps 6 inches in diameter, while the portion shown in FIG. 2 is only a few microns wide. A number of process steps would be performed to create transistors peripheral to the array, and these will not be discussed here. For example, the memory device may be of the complementary field-effect type having N-wells and P-wells formed in the substrate 24 as part of a prior process to create peripheral transistors.

Figure 4A:
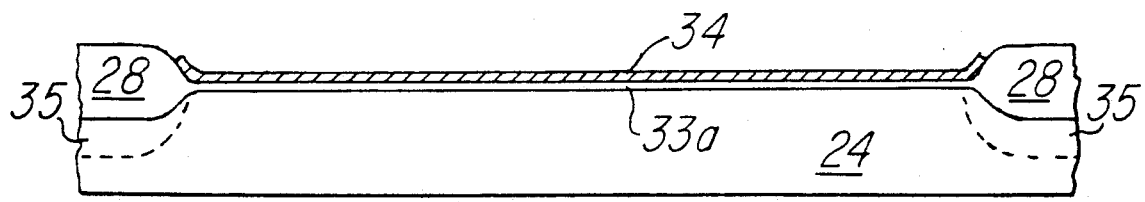
FIGS. 4i a–4f are elevation views in section of the semiconductor device of FIG. 2, taken along the lines a—a of FIG. 2 at successive stages in the manufacture thereof.

As illustrated in FIG. 4a, a layer 33a of oxide, then a layer 34 of nitride, are grown or deposited on the surface of P-substrate 24. The nitride layer 34 is patterned and etched to define an active device area that will include pairs of EEPROM cells sharing a common drain column line 19. Substrate layer 24 is then selectively doped with a boron implant at a dose of approximately $8 \times 10^{12}$ cm$^{-2}$ is performed to create P channel stop regions 35. Then, thick field oxide regions 28 are thermally grown in a localized oxidation process to a thickness of approximately 9000 Angstroms by exposing the substrate to steam for several hours using any conventional techniques. The thick field oxide regions 28 grow beneath the edges of adjacent nitride layer 34, creating bird's beaks instead of sharp transitions.

Figure 4B:
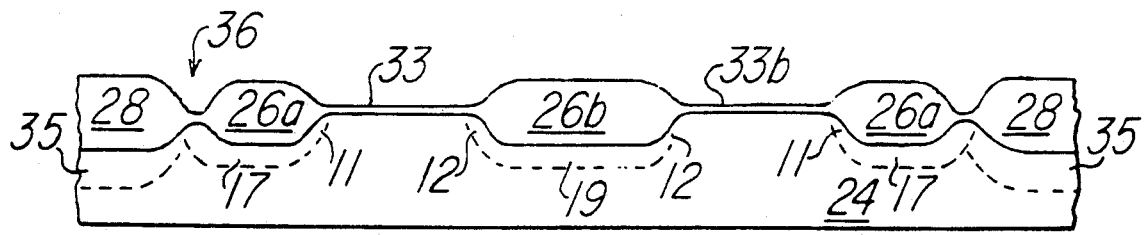

Referring next to FIG. 4b, the nitride layer 34 and oxide layer 33a are removed. A layer (not shown) of photoresist is deposited and patterned to act as an implant mask for selectively doping substrate layer 24 with an arsenic implant at a dose of about $6 \times 10^{15}$ cm$^{-2}$ and at an energy of about 135 KeV. This implant creates drain column line 19, including drain regions 12, and a pair of source column lines 17, including source regions 11. One complete pair of cells 10 is shown in the sections taken in FIGS. 4a–4f. Following the implant of the drain column line 19 and source column lines 17, another thermal step is performed with steam at 800°–900° C. to differentially grow thermal insulator regions 26a and 26b. The thermal oxide regions 26a and 26b will be grown to a thickness of approximately 2500 to 3500 Angstroms. At the same time, a new oxide insulator layer 33b between the drain regions 12 and the source regions 11 is grown to a thickness of approximately 200–300 Angstroms. The insulator regions 26a and 26b define the lateral limits of a pair of channel subregions 27a and 27b, described below.

At the transition areas 36 where bird's beaks have been formed, the edge of the originally-formed thick field oxide region 28 has masked the arsenic implant so that the concentration is lower. Therefore, the oxide growth in transition areas 36 is less than that of the thermal oxide regions 26a and 26b. As a result, the oxide thickness in the transition areas 36 is smaller than the thickness of thermal oxide regions 26a and 26b or than the thickness of field oxide regions 28. At this point, a self-aligned threshold-voltage-adjust implant may be performed in what will become sub-channel regions 27a and 27b.

Figure 4C:
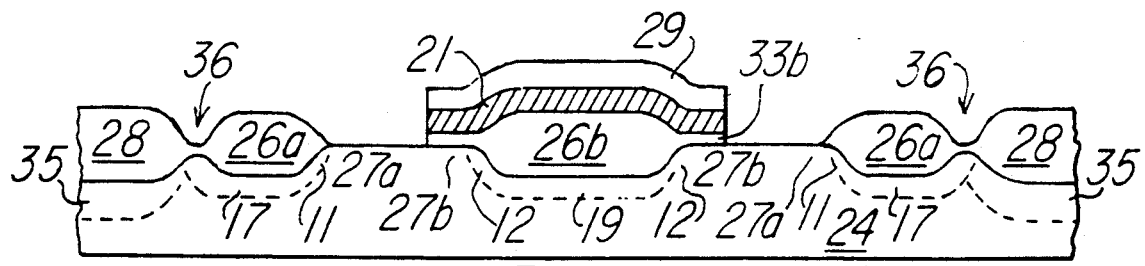

Referring next to FIG. 4c, a conductive layer, which will become field-plate conductors 21, of polycrystalline silicon (polysilicon) is deposited over the face of the slice. This conductive layer is deposited to a thickness of approximately 3500 Angstroms. The polysilicon conductive layer (also known as the "poly 1" layer) is highly doped to render it conductive. This may be accomplished, for example, by applying an N+ dopant to the polysilicon layer after it has been deposited. A relatively thick oxide insulator layer (or oxide-nitride insulator layer, or oxide-nitride-oxide insulator layer) which will become field-plate insulator layer 29, is deposited over layer 21. The insulator layer 29 is then patterned and etching is performed to form an elongate field-plate conductor layer 21 and field-plate insulator layer 29, at the same time removing oxide layer 33 over sub-channel region 27a.

Figure 4D:
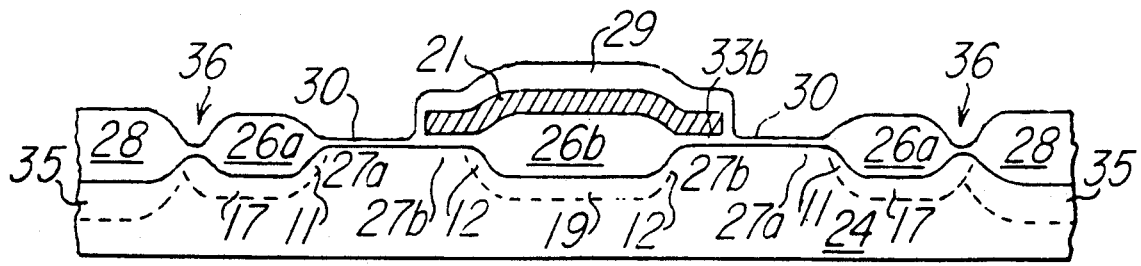

Referring to FIG. 4d, a relatively thin insulator layer 30, such as a oxide, is next grown or otherwise formed over the structure using conventional techniques. During this step, the exposed edges of field-plate conductor layer 21 are covered with insulation, providing necessary electrical isolation. At this stage, insulator layer 30 may be approximately 300 Angstroms thick. The oxide insulator on the edges of field-plate conductor layer 21 will be considerably thicker than 300 Angstroms if the oxidation rate ratios between un-doped single crystal silicon and heavily doped polysilicon are adjusted appropriately. Insulator layer 30 is the gate insulator over what will become sub-channel regions 27a.

Figure 4E:
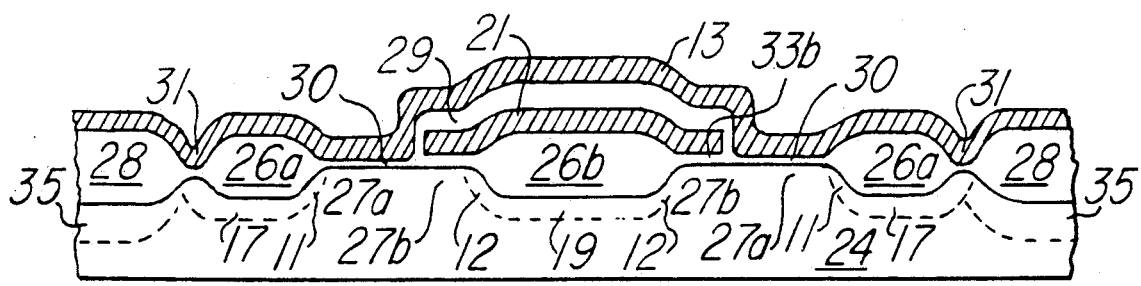

Referring next to FIG. 4e, tunnel windows are formed in the transition areas 36 of FIG. 4d. This is done by etching through the oxide over the transition areas 36 to the silicon using photoresist as a mask, then regrowing a thinner oxide insulator layer for the tunnel windows. This will create window insulator layers 31 that are approximately 100 Angstroms thick. At the time that this oxidation occurs, the gate oxide layer 30 will grow to approximately 350 Angstroms, depending on its thickness before this step, which may be adjusted as described above. Before etching the oxide in the transition areas 36, a light implant of phosphorous dopant is preferably employed through the tunnel window areas 31 to improve the operation of the cells. Because of the curved surfaces of the transition areas 36, the width of the tunnel windows 31 may be controlled by varying the length of time for the etch through the transition areas 36. This self-aligned, sublithographic window is discussed in the aforementioned application Ser. No. 07/360,558, for example. A second polycrystalline silicon layer ("poly 2"), which will become floating-gate conductors 13, is deposited over the face of the slice and is highly doped to be N+.

Figure 4F:
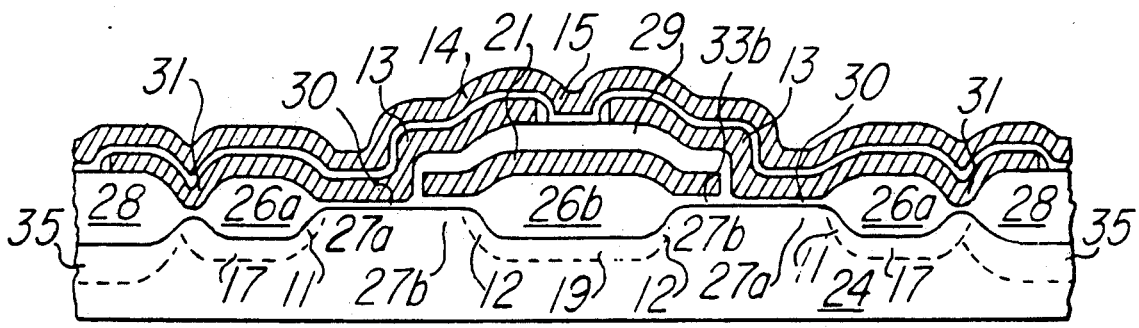

Referring now to FIG. 4f, second polysilicon layer is etched to form floating-gate strips, which will become floating-gate conductors 13. The edges of the lines that will form floating-gate conductors 13 may be protected by forming sidewall oxide regions using conventional procedure. Inter-level insulator layer 25 is then formed over the structure, including second polysilicon layer 13. Inter-level insulator layer 25 can be an oxide layer, an oxide-nitride-oxide layer, or another suitable insulator-material layer. A third polycrystalline silicon layer ("poly 3"), which will become control gates 14/row lines 15 is then deposited over the face of the slice and is highly doped to be N+. After de-glazing, a stack etch of (1) the third polysilicon layer 14,15, (2) the inter-level insulator layer 25, and (3) the second poly strips 13 is performed. This stack etch defines a plurality of elongated control gates 14/row lines 15 that run substantially parallel to each other and at an angle to column lines 17, 19 and 22, as shown in FIGS. 2 and 3b–3d. This same stack etch separates and defines the remaining edges of the floating-gate conductors 13. The field-plate conductor 21 is masked by field-plate insulator layer 29 such that it continues to be an elongated conductor.

Peripheral logic CMOS devices may be completed after this step. An oxide layer may be grown after this process on the sides and top of the stack. A borophosphosilicate glass (BPSG) layer (not shown) may then be deposited over the face of the slice. Off-array contacts may be made through the BPSG layer, as well as on-array contacts that are made from metal bitlines to respective diffused regions periodically in a y-direction. The metal bit lines are formed on the BPSG layer to run over and be parallel to diffused regions.

While the invention has been described with reference to an illustrative embodiment, this description is not meant to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments that fall within the true scope of the invention.

What is claimed is:

1. A method for fabricating at least first and second electrically erasable and programmable memory cells at a face of a semiconductor layer having a first conductivity type, comprising the steps of:

selectively doping said semiconductor layer with a dopant of a second conductivity type opposite said first conductivity type to create a source region of said first cell, a drain column diffusion including drain regions of said first and second cells, said drain region of said first cell spaced from the source region of said first cell by first and second sub-channel regions of said first cell, and a source region of said second cell spaced from said drain region of said second cell by first and second sub-channel regions of said second cell and spaced from said source region of said first cell;

differentially growing insulator regions over said face to create thermal insulator regions over said source and drain regions and a first insulator layer in between and on either side of said source and drain regions;

selectively etching through a second insulator layer, a first conductive layer underlying said second insulator layer, and said first insulator layer underlying said first conductive layer to define a field-plate conductor and a field-plate insulator over said drain regions and said first sub-channel regions adjacent said drain regions;

forming window areas on said face adjacent to said respective source regions and forming a thin window insulator layer over each said window area and forming a third insulator layer over said respective second sub-channel regions adjacent said source regions; and forming first and second floating-gate conductors each formed over a respective source region, window insulator and said second sub-channel region and forming a control-gate conductor over, and insulated from, said field-plate and floating-gate conductors.

2. The method of claim 1, and further comprising the steps of:

after said step of forming said third insulator layer;

forming floating-gate conductor strips over the face;

forming an oxide layer on said floating-gate conductor strips;

forming a nitride layer on said oxide layer; and forming a second oxide layer on said nitride layer to create a three-insulator oxide-nitride-oxide layer.

3. The method of claim 1, wherein said first and second cells are formed with a row of an array of rows and columns of such cells, the method further comprising:

selectively etching said first conductive layer to form spaced-apart field-plate column lines;

forming a floating-gate conductive layer;

forming spaced-apart floating-gate conductor strips from said floating-gate conductive layer;

forming a control-gate layer; and forming spaced-apart row lines, including said control-gate conductors, from said control-gate layer for each said row of cells, at the same time defining a plurality of said floating-gate conductors having edges that are aligned with the edges of said row line conductors.

4. The method of claim 1, and further including the step of implanting dopant through said window areas.

* * * * *